(12) United States Patent
Sekimoto et al.

(10) Patent No.: US 11,087,983 B2
(45) Date of Patent: Aug. 10, 2021

(54) THERMAL TREATMENT APPARATUS, THERMAL TREATMENT METHOD, AND NON-TRANSITORY COMPUTER STORAGE MEDIUM

(71) Applicant: Tokyo Electron Limited, Tokyo (JP)

(72) Inventors: Eiichi Sekimoto, Koshi (JP); Takeshi Saikusa, Koshi (JP); Hiroshi Seko, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 492 days.

(21) Appl. No.: 15/823,843

(22) Filed: Nov. 28, 2017

(65) Prior Publication Data

US 2018/0182611 A1 Jun. 28, 2018

(30) Foreign Application Priority Data

Dec. 22, 2016 (JP) .............................. JP2016-249127

(51) Int. Cl.
*H01L 21/027* (2006.01)
*H01L 21/67* (2006.01)
*G03F 7/20* (2006.01)

(52) U.S. Cl.
CPC ............ *H01L 21/027* (2013.01); *G03F 7/202* (2013.01); *H01L 21/67103* (2013.01); *H01L 21/67109* (2013.01); *H01L 21/67225* (2013.01); *H01L 21/67248* (2013.01)

(58) Field of Classification Search
CPC ............. H01L 21/027; H01L 21/67103; H01L 21/67109; H01L 21/67225; H01L 21/67248; H01L 21/67115; H01L 21/324; H01L 22/10; G03F 7/202; H05B 3/0047

USPC ....... 219/444.1, 446.1, 448.11; 396/611, 571
See application file for complete search history.

(56) References Cited

U.S. PATENT DOCUMENTS

| 7,467,901 | B2 * | 12/2008 | Kamei | ............. H01L 21/67109 219/444.1 |
| 2002/0177094 | A1 * | 11/2002 | Shirakawa | ........ H01L 21/67109 432/4 |
| 2009/0060480 | A1 * | 3/2009 | Herchen | ........... H01L 21/67248 392/416 |

FOREIGN PATENT DOCUMENTS

| JP | 10-189429 A | 7/1998 |
| JP | 2001-274064 | 10/2001 |
| JP | 2005-191265 A | 7/2005 |
| JP | 2006-173185 A | 6/2006 |
| JP | 2007-305728 A | 11/2007 |

* cited by examiner

*Primary Examiner* — Vishal Pancholi
*Assistant Examiner* — Robert K Nichols, II
(74) *Attorney, Agent, or Firm* — Posz Law Group, PLC

(57) ABSTRACT

A thermal treatment apparatus including a hot plate which heats a substrate mounted thereon, in a treatment chamber including a lid body covering a surface to be treated of the substrate mounted on the hot plate, the thermal treatment apparatus includes: a control unit which controls at least a temperature of the hot plate, and a temperature measuring unit which measures a temperature of the lid body, wherein the control unit is configured to perform, when a set temperature of the hot plate is changed, correction of a heating amount by the hot plate for obtaining the set temperature after change, based on the temperature of the lid body measured by the temperature measuring unit.

12 Claims, 11 Drawing Sheets

THERMAL TREATMENT APPARATUS, THERMAL TREATMENT METHOD, AND NON-TRANSITORY COMPUTER STORAGE MEDIUM

CROSS REFERENCE TO RELATED APPLICATIONS

This application is based upon and claims the benefit of priority of the prior Japanese Patent Application No. 2016-249127, filed in Japan on Dec. 22, 2016, the entire contents of which are incorporated herein by reference.

BACKGROUND OF THE INVENTION

1. Field of the Invention

The present invention relates to a thermal treatment apparatus, a thermal treatment method, and a non-transitory computer storage medium, that perform a thermal treatment on a substrate.

2. Description of the Related Art

In a photolithography process in a manufacturing process of a semiconductor device, for example, a coating treatment of applying a coating solution onto a film to be treated on the surface of a semiconductor wafer (hereinafter, referred to as a "wafer") as a substrate to form an anti-reflection film or a resist film, exposure processing of exposing the resist film in a predetermined pattern, a developing treatment of developing the exposed resist film, a thermal treatment of heating the wafer and so on are sequentially performed to form a predetermined resist pattern on the wafer. Then, an etching treatment is performed using the resist pattern as a mask, thereby transferring the predetermined pattern to the film to be treated.

The thermal treatment is performed by a thermal treatment apparatus. The thermal treatment apparatus has a hot plate on which the substrate is mounted and which heats the substrate, and a lid body which covers the upper surface of the hot plate to form a treatment chamber. Then, in the treatment chamber formed by the lid body, the substrate is mounted and heated on the hot plate set to a predetermined temperature.

Incidentally, when the heating temperature for the substrate is changed based on a process recipe, the set temperature of the hot plate comes to be changed. The lid body forming the treatment chamber is larger in heat capacity than the hot plate, and thus takes more time to become a state where the temperature becomes stable than the hot plate in this event.

In addition, the heating treatment on the substrate is influenced not only by the temperature of the hot plate but also by the temperature of the lid body, so that the thermal treatment on the substrate becomes unstable to cause variation in quality of the substrate unless the temperature of the lid body is in a steady state. Besides, if the thermal treatment is tried to be performed after waiting until the temperature of the lid body becomes a stable state, extra time is required to cause a decrease in throughput.

Hence, a thermal treatment apparatus in Japanese Laid-open Patent Publication No. H10-189429 has a temperature regulation unit capable of regulating the temperature provided on a surface on the outside of a lid body so that the temperature of the lid body is increased by the temperature regulation unit, for example, at a rise of a set temperature of the hot plate. Further, the thermal treatment apparatus in Japanese Laid-open Patent Publication No. H10-189429 can also cool the lid body with the temperature regulation unit composed of a Peltier element.

A thermal treatment apparatus in Japanese Laid-open Patent Publication No. 2001-274064 has a holding unit directly holding a lid body in a holding member moving the lid body in a vertical direction, which is configured to freely separate from the lid body to be able to reduce the heat capacity of the lid body. Accordingly, when the holding unit is separated at the rise of a temperature of the hot plate, the temperature of the lid body quickly rises and quickly becomes a stable state.

However, if the thermal treatment apparatus in Japanese Laid-open Patent Publication No. H10-189429 is configured such that the Peltier element is used at the time of cooling the lid body when the set temperature of the hot plate is changed, the configuration of the apparatus becomes complicated. Besides, if the temperature regulation unit of the thermal treatment apparatus in Japanese Laid-open Patent Publication No. H10-189429 is provided with only a heating function but not provided with any cooling function so that the cooling of the lid body is performed by natural cooling, the heat capacity of the lid body greatly increases due to the provision of the temperature regulation unit at the lid body. This requires time for cooling the lid body, namely, requires time until the lid body becomes a stable state. Accordingly, the thermal treatment on the substrate becomes unstable just after the change of the temperature of the hot plate, causing variation in quality of the substrate subjected to the thermal treatment.

In the thermal treatment apparatus in Japanese Laid-open Patent Publication No. 2001-274064, even if the holding unit of the lid body is made attachable and detachable to/from the lid body, the heat capacity of the lid body is large and therefore there is a limit in reducing the time until the temperature of the lid body becomes a stable state when the temperature of the hot plate is changed, and a further reduction is desired to suppress variation in quality of the substrate in some cases.

SUMMARY OF THE INVENTION

The present invention has been made in view of the above points, and its object is to make it possible to suppress, in a thermal treatment apparatus that performs a thermal treatment on a substrate, variation in quality of the substrate even with a simple configuration of the apparatus.

To achieve the above object, one aspect of the present invention is a thermal treatment apparatus including a hot plate on which a substrate is mounted and which heats the mounted substrate, in a treatment chamber including a lid body covering a surface to be treated of the substrate mounted on the hot plate, the thermal treatment apparatus including: a control unit which controls at least a temperature of the hot plate, and a temperature measuring unit which measures a temperature of the lid body, wherein the control unit is configured to perform, when a set temperature of the hot plate is changed, correction of a heating amount by the hot plate for obtaining the set temperature after change, based on the temperature of the lid body measured by the temperature measuring unit.

In the above-described thermal treatment apparatus in the one aspect of the present invention, when a set temperature of the hot plate is changed, the substrate temperature is controlled to be constant by correcting the heating amount by the hot plate on the basis of the current temperature of the lid body measured by the temperature measuring unit, so that the variation in quality among substrates can be suppressed even when the thermal treatment is continuously performed on the substrates after change of the set temperature. Accordingly, the variation in quality of substrates can be suppressed with a simple configuration.

One aspect of the present invention according to another viewpoint is a thermal treatment method of heating a substrate by a hot plate on which the substrate is mounted, the thermal treatment method including: a measurement step of measuring a temperature of a lid body covering a surface to be treated of the substrate and constituting a treatment chamber; and a correction step of performing, when a set temperature of the hot plate is changed, correction of a heating amount by the hot plate for obtaining the set temperature after change, based on the measured temperature of the lid body.

One aspect of the present invention according to still another viewpoint is a non-transitory computer-readable storage medium storing a program running on a computer of a control unit that controls a thermal treatment apparatus to cause the thermal treatment apparatus to execute the thermal treatment method.

DETAILED DESCRIPTION OF THE INVENTION

Hereinafter, embodiments of the present invention will be described. Note that in this specification and the drawings, components having substantially the same functional configurations are denoted by the same codes to omit duplicate description.

Figure 1:
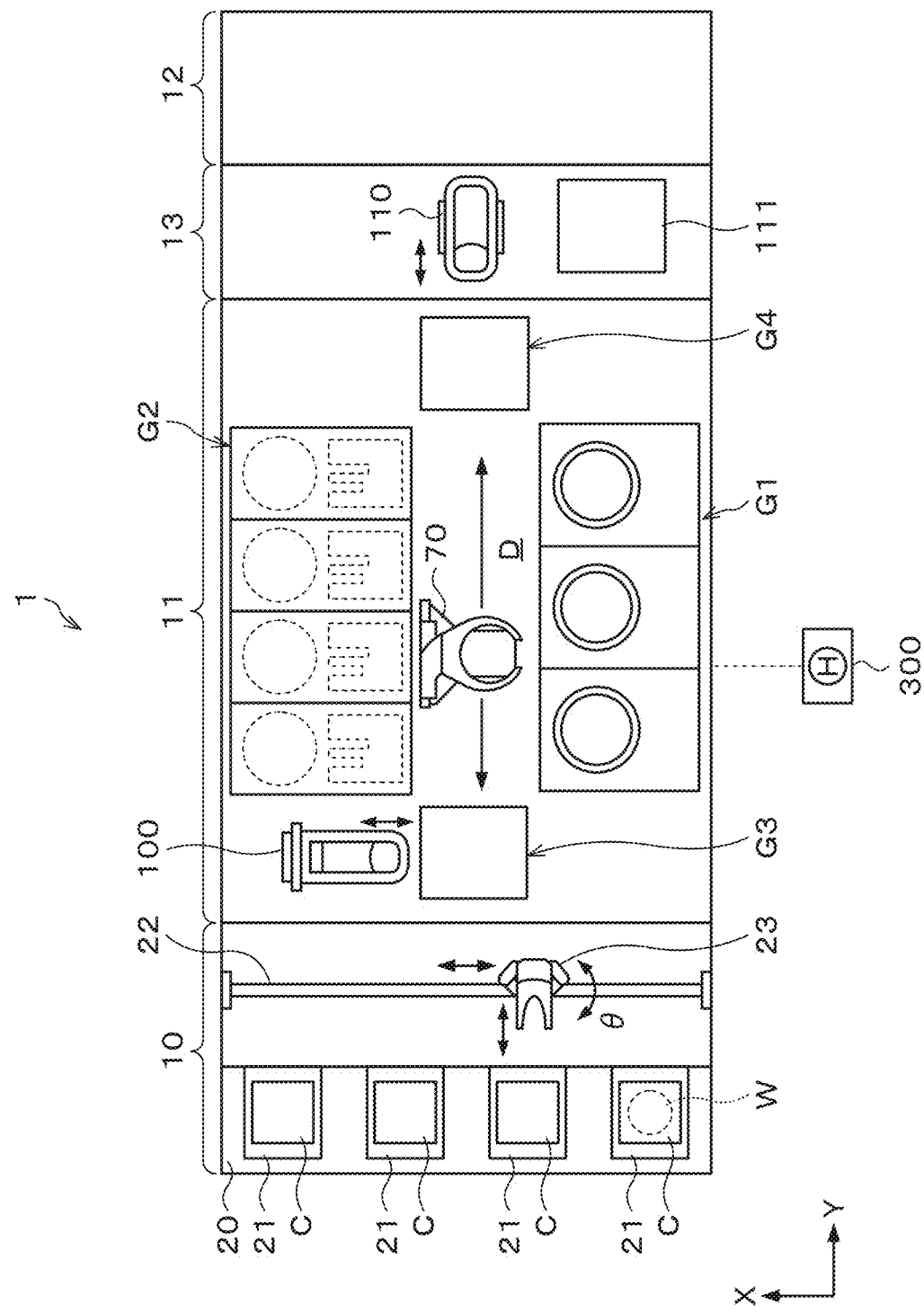
FIG. 1 is a plan view illustrating the outline of a configuration of a substrate treatment system including a thermal treatment apparatus according to an embodiment.
Figure 2:
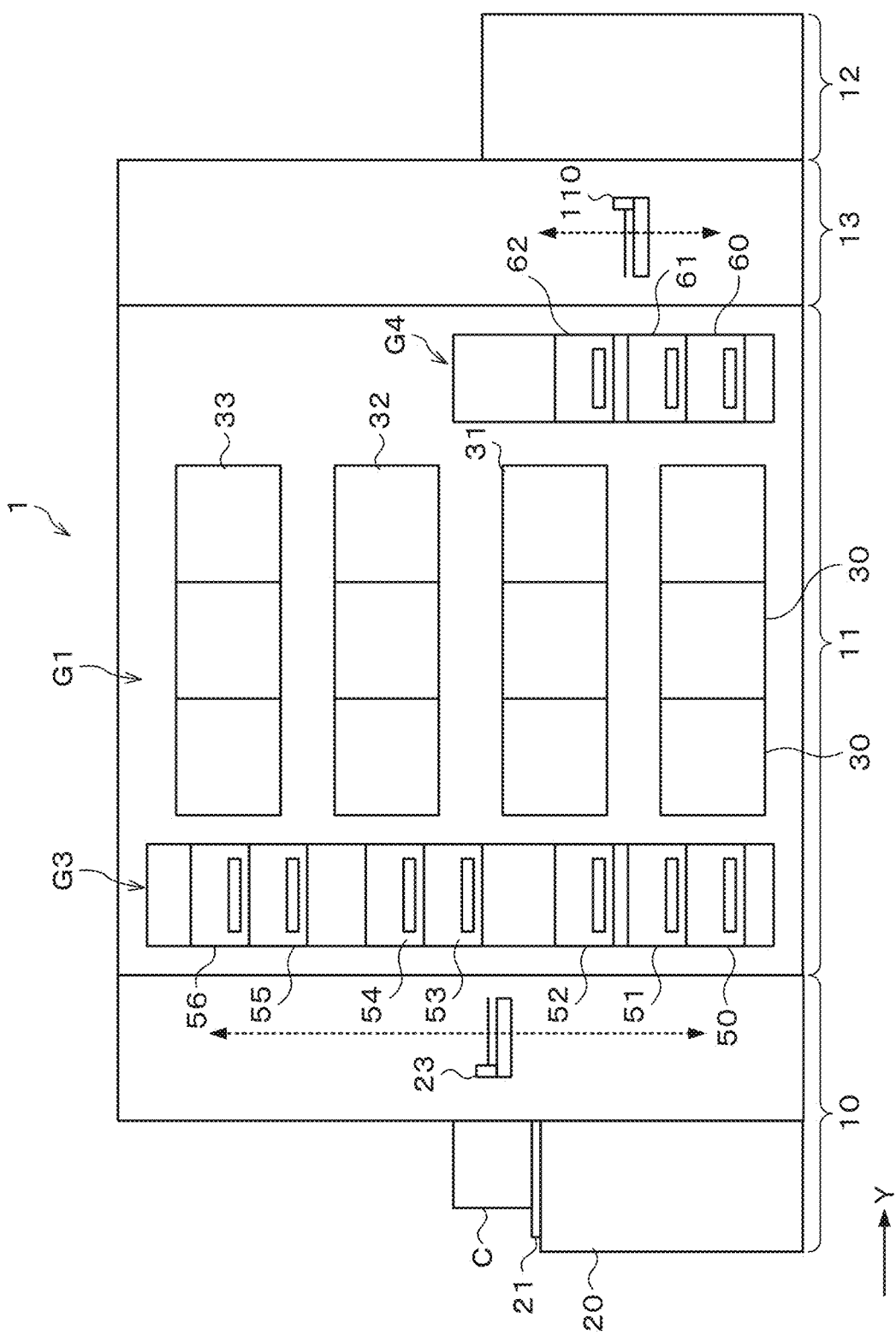
FIG. 2 is a front view illustrating the outline of the configuration of the substrate treatment system in FIG. 1.
Figure 3:
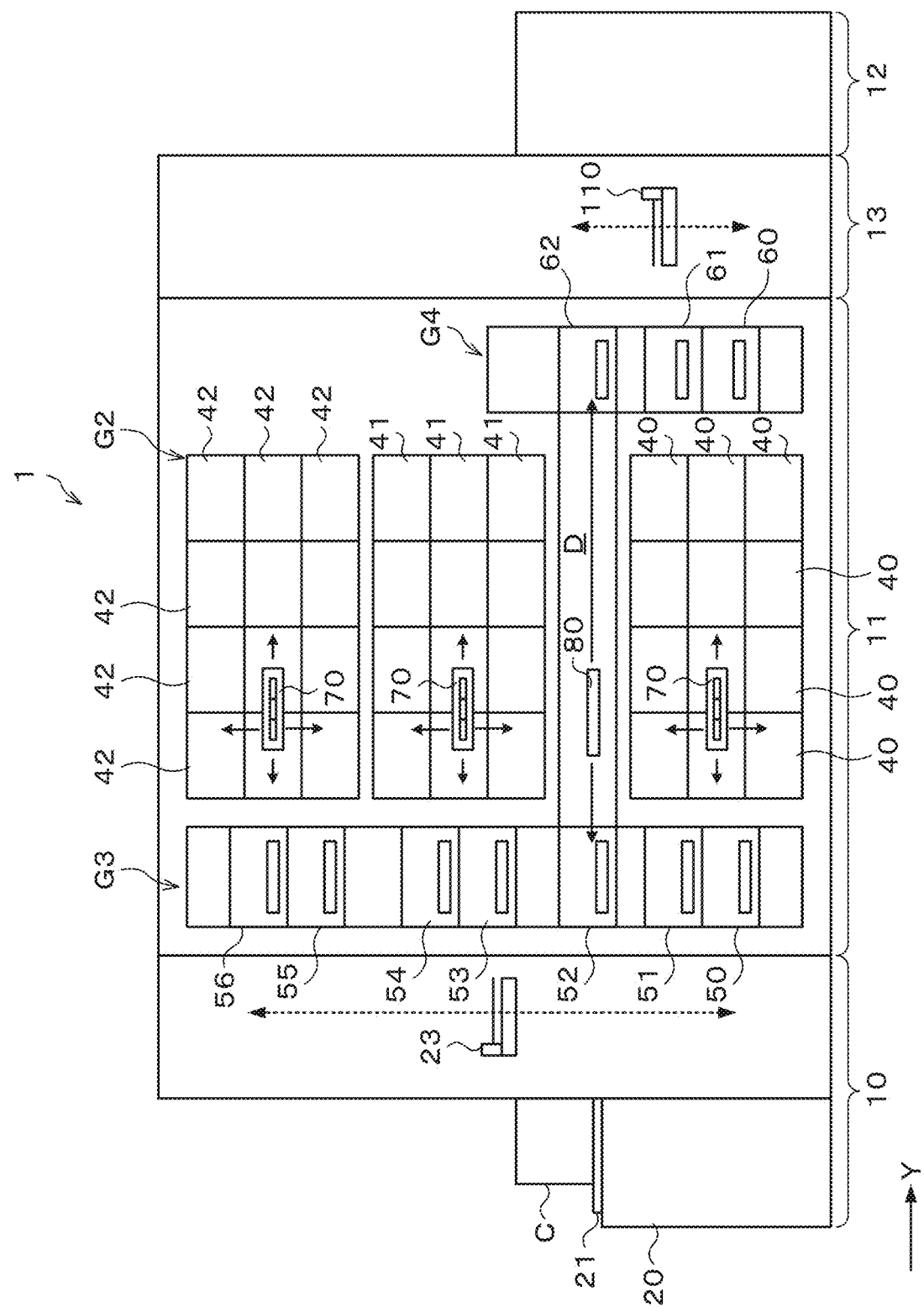
FIG. 3 is a rear view illustrating the outline of the configuration of the substrate treatment system in FIG. 1.

FIG. 1 is an explanatory view illustrating the outline of a configuration of a substrate treatment system 1 including a thermal treatment apparatus according to an embodiment. FIG. 2 and FIG. 3 are a front view and a rear view illustrating the outline of an internal configuration of the substrate treatment system 1, respectively. Note that this embodiment will be described using, as an example, a case where the substrate treatment system 1 is a coating and developing treatment system that performs coating and developing treatments on the wafer W.

The substrate treatment system 1 has, as illustrated in FIG. 1, a configuration in which a cassette station 10 into/out of which a cassette C housing a plurality of wafers W is carried, a treatment station 11 which includes a plurality of various treatment apparatuses performing predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with, for example, four cassette mounting plates 21 on which the cassettes C are mounted when the cassettes C are carried in/out from/to the outside of the substrate treatment system 1.

In the cassette station 10, a wafer carrier apparatus 23 is provided which is movable on a carrier path 22 extending in an X-direction as illustrated in FIG. 1. The wafer carrier apparatus 23 is movable also in a vertical direction and around a vertical axis (in a θ-direction), and can carry the wafer W between the cassette C on each of the cassette mounting plates 21 and a later-described delivery apparatus in a third block G3 in the treatment station 11.

In the treatment station 11, a plurality of, for example, four blocks G1, G2, G3, G4 including various apparatuses are provided. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution to the wafer W to form the resist film, and upper anti-reflection film forming apparatuses 33 each of which forms an anti-reflection film (hereinafter, referred to as an "upper anti-reflection film") at an upper layer of the resist film of the wafer W, are arranged in this order from the bottom.

For example, the developing treatment apparatuses 30, the lower anti-reflection film forming apparatuses 31, the resist coating apparatuses 32, and the upper anti-reflection film forming apparatuses 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the developing treatment apparatuses 30, the lower anti-reflection film forming apparatuses 31, the resist coating apparatuses 32, and the upper anti-reflection film forming apparatuses 33, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W.

For example, in the second block G2, as illustrated in FIG. 3, thermal treatment apparatuses 40 each of which performs thermal treatments such as heating and cooling on the wafer W, adhesion apparatuses 41 each of which performs a hydrophobizing treatment on the wafer W, and edge exposure apparatuses 42 each of which exposes the outer peripheral portion of the wafer W, are provided side by side in the vertical direction and in the horizontal direction. The thermal treatment apparatus 40 has a hot plate that mounts and heats the wafer W thereon and a temperature regulation plate that mounts and temperature-regulates the wafer W thereon to perform both a heat treatment and a temperature regulation treatment, whose configuration will be described later. The numbers and the arrangement of the thermal treatment apparatuses 40, the adhesion apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

In a region surrounded by the first block G1 to the fourth block G4, a wafer carry region D is formed as illustrated in FIG. 1. In the wafer carry region D, for example, a plurality of wafer carrier apparatuses 70 are arranged each of which has a carrier arm movable, for example, in the Y-direction, the X-direction, the θ-direction, and the vertical direction. The wafer carrier apparatus 70 can move in the wafer carry region D to carry the wafer W to a predetermined apparatus in the first block G1, the second block G2, the third block G3 and the fourth block G4 thereabout.

Further, in the wafer carry region D, a shuttle carrier apparatus 80 is provided which linearly carries the wafer W between the third block G3 and the fourth block G4.

The shuttle carrier apparatus 80 is configured to be linearly movable, for example, in the Y-direction. The shuttle carrier apparatus 80 can move in the Y-direction while supporting the wafer W to carry the wafer W between the delivery apparatus 52 in the third block G3 and the delivery apparatus 62 in the fourth block G4.

As illustrated in FIG. 1, a wafer carrier apparatus 100 is provided adjacent on the X-direction positive direction side of the third block G3. The wafer carrier apparatus 100 has a carrier arm that is movable, for example, in the X-direction, the θ-direction, and the vertical direction. The wafer carrier apparatus 100 can move up and down while supporting the wafer W to carry the wafer W to each of the delivery apparatuses in the third block G3.

In the interface station 13, a wafer carrier apparatus 110 and a delivery apparatus 111 are provided. The wafer carrier apparatus 110 has a carrier arm that is movable, for example, in the Y-direction, the θ-direction, and the vertical direction. The wafer carrier apparatus 110 can carry the wafer W to/from each of the delivery apparatuses in the fourth block G4, the delivery apparatus 111 and the exposure apparatus 12, for example, while supporting the wafer W by the carrier arm.

The above substrate treatment system 1 is provided with a control unit 300 as illustrated in FIG. 1. The control unit 300 is, for example, a computer and has a program storage unit (not illustrated). In the program storage unit, a program for controlling the treatments on the wafer W in the substrate treatment system 1 is stored. In addition, programs for realizing a later-described substrate treatment in the substrate treatment system 1 by controlling the operations of the above-described various treatment apparatuses and the drive system such as the carrier apparatuses, are also stored in the program storage unit. Note that the programs may be the ones that are recorded, for example, in a computer-readable storage medium H such as a computer-readable hard disk (HD), flexible disk (FD), compact disk (CD), magneto-optical disk (MO), or memory card, and installed from the storage medium H into the control unit 300.

The substrate treatment system 1 according to this embodiment is configured as described. Next, the wafer treatment performed using the substrate treatment system 1 will be described also using FIG. 4.

First, a cassette C housing a plurality of wafers W is carried into the cassette station 10 of the substrate treatment system 1, and each of the wafers W in the cassette C is successively carried by the wafer carrier apparatus 23 to the delivery apparatus 53 in the treatment station 11.

Then, the wafer W is carried by the wafer carrier apparatus 70 to the thermal treatment apparatus 40 in the second block G2 and subjected to a temperature regulation treatment. Thereafter, the wafer W is carried by the wafer carrier apparatus 70, for example, to the lower anti-reflection film forming apparatus 31 in the first block G1, in which a lower anti-reflection film is formed on the wafer W. The wafer W is thereafter carried to the thermal treatment apparatus 40 in the second block G2 and subjected to a thermal treatment.

The wafer W carried to the thermal treatment apparatus 40 is first mounted on a cooling plate 160. Subsequently, the cooling plate 160 is moved to above a hot plate 132. Then, raising and lowering pins 141 rise to deliver the wafer W on the cooling plate 160 to the raising and lowering pins 141. Thereafter, the cooling plate 160 retreats from above the hot plate 132, and the raising and lowering pins 141 lower to deliver the wafer W onto the hot plate 132.

After the thermal treatment is performed on the wafer W for a predetermined time, the raising and lowering pins 141 rise to move the wafer W to above the hot plate 132, the cooling plate 160 is moved to above the hot plate 132, and the wafer W is delivered from the raising and lowering pins 141 to the cooling plate 160. The wafer W delivered to the cooling plate 160 is cooled, for example, to ordinary temperature, and carried out of the thermal treatment apparatus 40.

The wafer W for which the thermal treatment in the thermal treatment apparatus 40 is finished is carried to the resist coating apparatus 32, in which a resist film is formed on the wafer W. The wafer W is thereafter carried to the thermal treatment apparatus 40 and subjected to a pre-baking treatment. Note that the same treatment as the thermal treatment after formation of the lower anti-reflection film is performed also in the pre-baking treatment, and the same treatment is performed also in a later-described thermal treatment after formation of an anti-reflection film, a post-exposure baking treatment, and a post-baking treatment. However, the thermal treatment apparatuses 40 used for the thermal treatments are different from one another.

Next, the wafer W is carried to the upper anti-reflection film forming apparatus 33, in which an upper anti-reflection film is formed on the wafer W. The wafer W is thereafter carried to the thermal treatment apparatus 40 and heated to be temperature-regulated. Thereafter, the wafer W is carried to the edge exposure apparatus 42 and subjected to edge exposure processing.

Then, the wafer W is carried to the exposure apparatus 12 and subjected to exposure processing in a predetermined pattern.

Then, the wafer W is carried to the thermal treatment apparatus 40 and subjected to a post-exposure baking treatment. The wafer W is thereafter carried, for example, to the developing treatment apparatus 30 and subjected to a developing treatment. After the developing treatment is finished, the wafer W is carried to the thermal treatment apparatus 40 and subjected to a post-baking treatment. Thereafter, the wafer W is carried to the cassette C on the cassette mounting plate 21, with which a series of photolithography process ends.

First Embodiment

Figure 4:
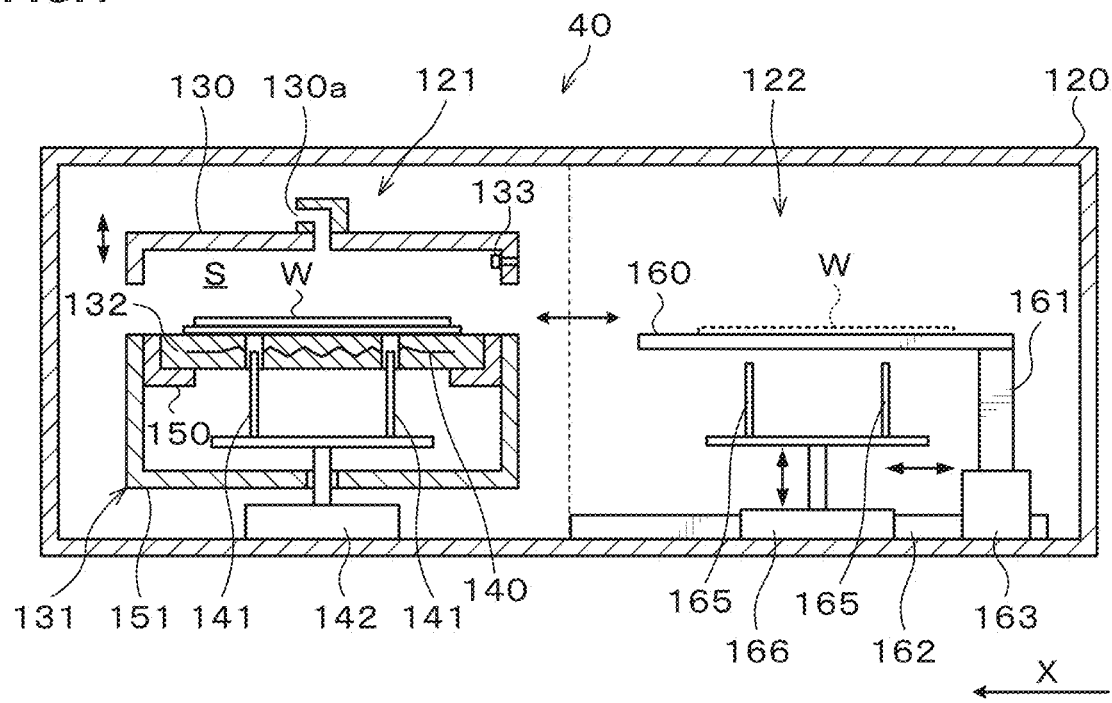
FIG. 4 is an explanatory view of a longitudinal section illustrating the outline of a configuration of a thermal treatment apparatus according to a first embodiment.
Figure 5:
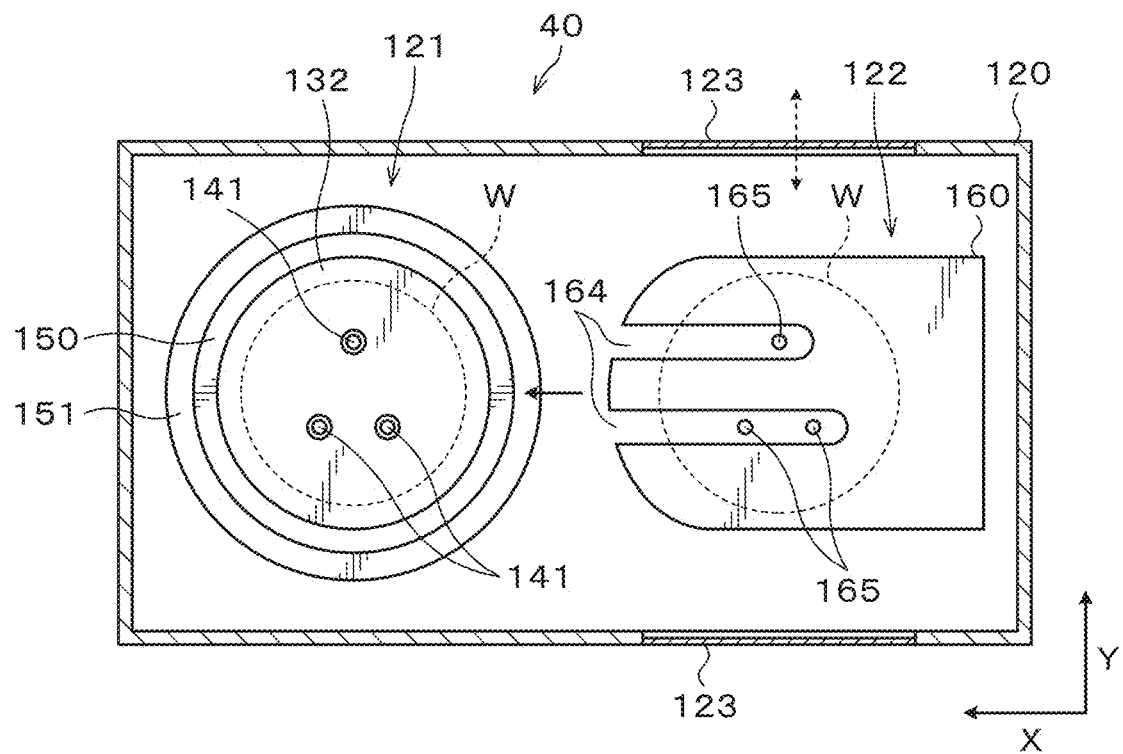
FIG. 5 is an explanatory view of a transverse section illustrating the outline of the configuration of the thermal treatment apparatus according to the first embodiment.

Next, a configuration of a thermal treatment apparatus 40 according to a first embodiment will be described. The thermal treatment apparatus 40 includes, for example, a heating unit 121 that performs a heat treatment on the wafer W and a cooling unit 122 that performs a cooling treatment on the wafer W in a casing 120 as illustrated in FIG. 4 and FIG. 5. As illustrated in FIG. 5, in both side surfaces of the casing 120 near the cooling unit 122 are formed with carry-in/out ports 123 for carrying in/out the wafer W.

The heating unit 121 includes a lid body 130 that is located on the upper side and movable up and down, and a hot plate accommodating unit 131 that is located on the lower side and unites with the lid body 130 to form a treatment chamber S as illustrated in FIG. 4.

The lid body 130 has an almost cylindrical shape with a lower surface open, and covers an upper surface being a surface to be treated of the wafer W mounted on a later-described hot plate 132. At an upper surface central portion of the lid body 130, an exhaust unit 130a is provided. The atmosphere inside the treatment chamber S is exhausted from the exhaust unit 130a.

Further, the lid body 130 is provided with a temperature sensor 133 being a temperature measuring unit that measures the temperature of the lid body 130. The temperature sensor 133 is provided at an end portion of the lid body 130 in the example of the drawing, but may be provided at a central portion or the like of the lid body 130.

At the center of the hot plate accommodating unit 131, the hot plate 132 is provided on which the wafer W is mounted and which heats the mounted wafer W. The hot plate 132 has an almost disk shape with a large thickness in which a heater 140 that heats the upper surface of the hot plate 132, namely, a mounting surface for the wafer W is provided. As the heater 140, for example, an electric heater is used. The configuration of the hot plate 132 will be described later.

Inside the hot plate accommodating unit 131, raising and lowering pins 141 are provided which penetrate the hot plate 132 in the thickness direction. The raising and lowering pins 141 freely rise and lower by means of a raising and lowering drive unit 142 such as a cylinder and can project to above the upper surface of the hot plate 132 to deliver the wafer W to/from the later-described cooling plate 160.

The hot plate accommodating unit 131 has, for example, a holding member 150 in a ring shape that accommodates the hot plate 132 and holds the outer peripheral portion of the hot plate 132, and a support ring 151 in an almost cylindrical shape surrounding the outer periphery of the holding member 150 as illustrated in FIG. 4.

In the cooling unit 122 adjacent to the heating unit 121, for example, the cooling plate 160 that mounts and cools the wafer W thereon is provided. The cooling plate 160 has an almost square flat plate shape and has an end face on the heating unit 121 side curved in an arc shape as illustrated in FIG. 5. Inside the cooling plate 160, a not-illustrated cooling member such as a Peltier element or the like is embedded and can regulate the cooling plate 160 to a predetermined set temperature.

The cooling plate 160 is supported, for example, by a supporting arm 161 and the supporting arm 161 is attached to a rail 162 extending in the X-direction toward the heating unit 121 side as illustrated in FIG. 4. The cooling plate 160 can move on the rail 162 by a drive mechanism 163 attached to the supporting arm 161. Thus, the cooling plate 160 can move to above the hot plate 132 on the heating unit 121 side.

In the cooling plate 160, for example, two slits 164 are formed along the X-direction as illustrated in FIG. 5. The slits 164 are formed from the end face on the heating unit 121 side of the cooling plate 160 to the vicinity of the central portion of the cooling plate 160. The slits 164 can prevent interference between the cooling plate 160 moved to the heating unit 121 side and the raising and lowering pins 141 above the hot plate 132. As illustrated in FIG. 4, below the cooling plate 160 located in the cooling unit 122, raising and lowering pins 165 are provided. The raising and lowering pins 165 can rise and lower by means of a raising and lowering drive unit 166. The raising and lowering pins 165 can rise from below the cooling plate 160, pass through the slits 164, project to above the cooling plate 160, and deliver the wafer W, for example, to/from the wafer carrier apparatus 70 entering the inside of the casing 120 from the carry-in/out port 123.

Figure 6:
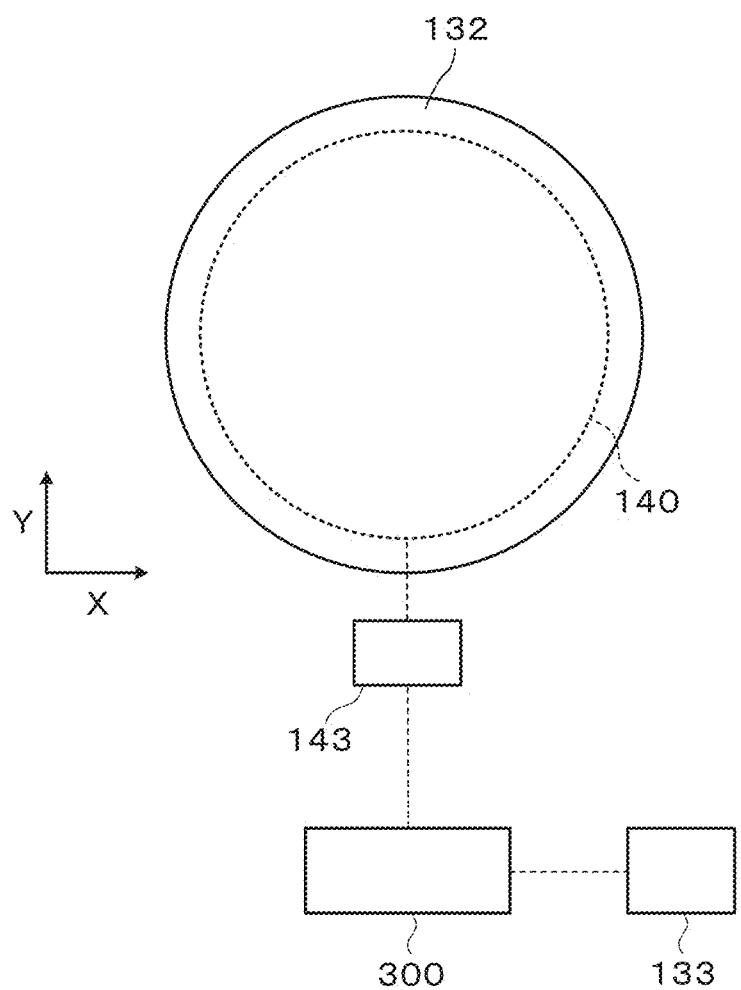
FIG. 6 is an explanatory view of a plane illustrating the outline of a configuration of a hot plate of the thermal treatment apparatus according to the first embodiment.

Next, the configuration of the hot plate 132 will be described in detail. As illustrated in FIG. 6, the hot plate 132 includes one heating unit, namely, a heater 140 for one hot plate 132.

The heating value of the heater 140 is regulated by a control unit 300 via a hot plate temperature regulator 143. The hot plate temperature regulator 143 can regulate the heating value of the heater 140 to control the temperature of the hot plate 132 to a predetermined set temperature.

To the control unit 300, a measured result of the temperature of the lid body 130 measured by the temperature sensor 133 is inputted.

When the heating temperature for the wafer W is changed by change of a process recipe such as change of the kind of the resist or the like, the set temperature of the hot plate 132 comes to be changed.

As described above, in the conventional thermal treatment apparatus, namely, the thermal treatment apparatus that is not provided with any temperature regulating mechanism for the lid body so that the cooling of the lid body is performed by natural cooling, when a plurality of wafers are successively treated after change of the set temperature, there occurs variation in quality among the wafers. One cause of this is time required until the temperature of the lid body becomes a stable state.

Figure 7:
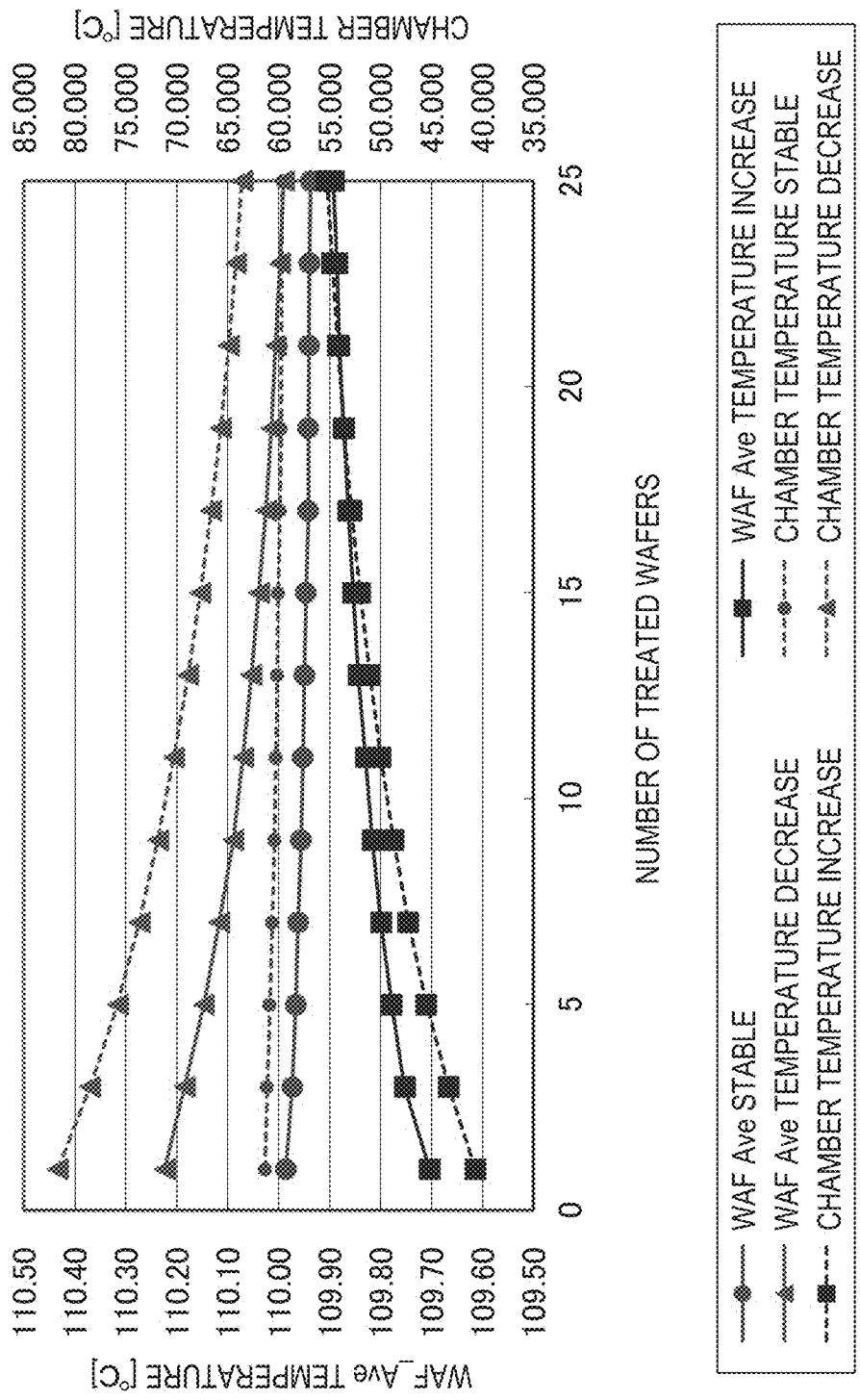
FIG. 7 is a graph illustrating measurement results of an in-plane average temperature of a wafer and a temperature of a lid body at the time when a thermal treatment was continuously performed in a conventional thermal treatment apparatus.

Hence, the present inventors first measured an in-plane average temperature of the wafer and the temperature of the lid body at the time when the thermal treatment was continuously performed after the temperature of the lid body became a stable state after the set temperature of the hot plate was changed, and at the time when the thermal treatment was continuously performed just after the set temperature of the hot plate was changed, in the conventional thermal treatment apparatus. FIG. 7 is a graph illustrating the in-plane average temperature of the wafer and the temperature of the lid body, in the case of an n-th wafer in the continuous treatment.

In FIG. 7, the horizontal axis represents the number of treated wafers, and the vertical axis represents the in-plane average temperature of the wafer (WAF Ave temperature) or the temperature of the lid body (chamber temperature). The in-plane average temperature of the wafer is measured by a wafer-type temperature measuring apparatus that imitates the wafer and has a plurality of temperature sensors and the like mounted thereon, is a temperature at 60 seconds after the wafer is mounted on the hot plate (wafer-type temperature measuring apparatus), and is an average value of temperatures measured at 29 points within a measurement plane of the wafer (wafer-type temperature measuring apparatus) in this example.

As illustrated in FIG. 7, there is no variation in the in-plane average temperature and in the temperature of the lid body among wafers in the case where the thermal treatment was continuously performed after the temperature of the lid body became a stable state after a lapse of a predetermined time after the set temperature of the hot plate was changed to 110° C.

However, in the case where the thermal treatment was continuously performed just after the set temperature of the hot plate was changed to 110° C., there is a large difference in the in-plane average temperature and in the temperature of the lid body between the first wafer and the 25th wafer and there is variation between the wafers.

Based on the measured result, the present inventors investigated the relation between the in-plane average temperature of the wafer and the temperature of the lid body between the time when the thermal treatment was continuously performed after the temperature of the lid body became a stable state after the set temperature of the hot plate was changed, and the time when the thermal treatment was continuously performed just after the set temperature of the hot plate was changed.

Figure 8:
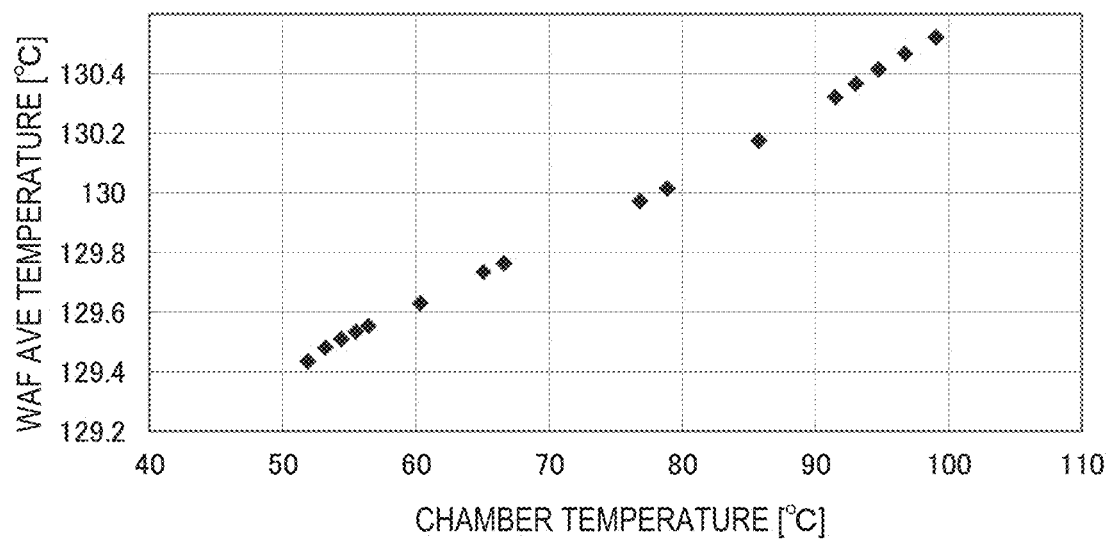
FIG. 8 is a graph illustrating a relation between the in-plane average temperature of the wafer and the temperature of the lid body at the time when the thermal treatment was continuously performed in the conventional thermal treatment apparatus.

FIG. 8 is a graph illustrating the above-described relation between the in-plane average temperature of the wafer and the temperature of the lid body. In FIG. 8, the horizontal axis represents the temperature of the lid body, and the vertical axis represents the in-plane average temperature of the wafer. As illustrated in FIG. 8, it is inferred that there is an almost directly proportional correlation between them.

Based on the above knowledge, contribution of the heating amount by the heater 140 of the hot plate 132 to the in-plane average temperature of the wafer W, and a heat capacity of the hot plate 132 much smaller than that of the lid body 130, in this embodiment, the temperature of the lid body 130 is measured and correction of the heating amount by the heater 140 of the hot plate 132 is performed based on the measured result to make the temperature of the hot plate 132 quickly become stable in the thermal treatment on the wafer W by the hot plate 132. The correction of the heating amount is performed at least when the set temperature of the hot plate 132 is changed. The correction of the heating amount is performed until the temperature of the lid body 130 becomes stable.

The correction of the heating amount is concretely performed as follows for instance. Specifically, a stable-time lid body temperature being the temperature of the lid body when the temperature of the lid body 130 becomes stable after change to the set temperature, is stored in a storage unit (not illustrated) for each set temperature of the hot plate 132.

When the set temperature of the hot plate 132 is changed, the control unit 300 corrects the heating amount by the heater 140 of the hot plate 132 on the basis of the difference between the temperature of the lid body 130 measured by the temperature sensor 133 and the stable-time lid body temperature corresponding to the set temperature after change.

The correction of the heating amount performed by the control unit 300 is regulation of an operation amount of the heater 140 outputted from the hot plate temperature regulator 143. The control unit 300 feedback-controls the temperature of the lid body 130 through the regulation so that the temperature of the lid body 130 becomes the stable-time lid body temperature corresponding to the set temperature after change.

Figure 9:
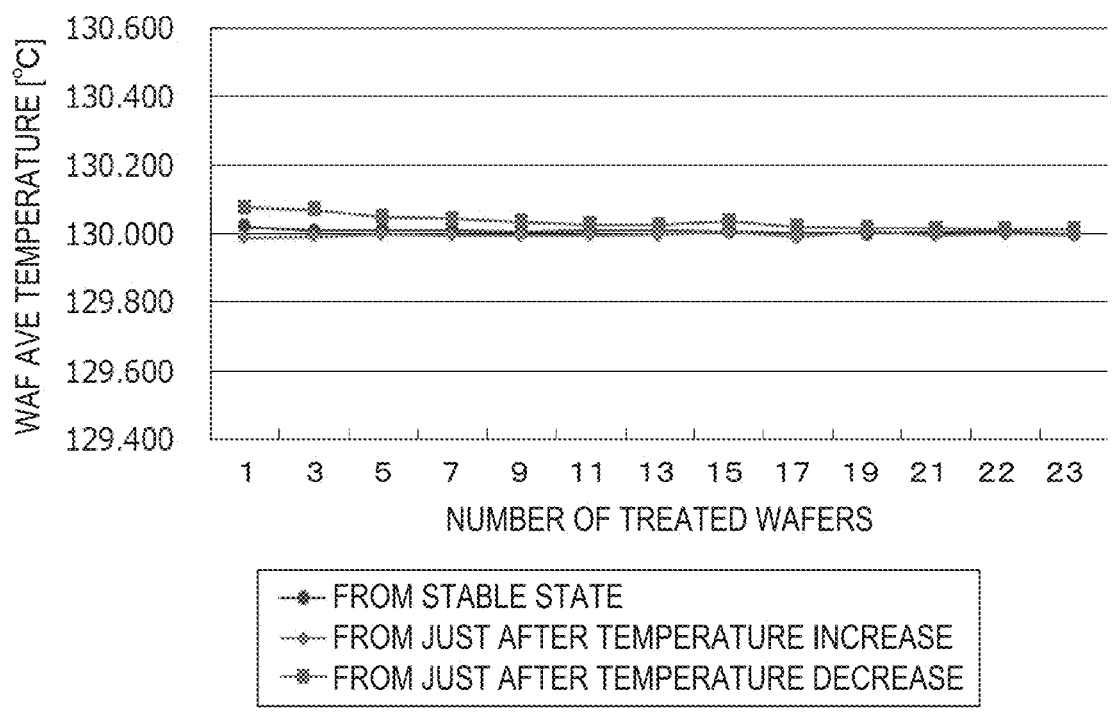
FIG. 9 is a graph illustrating an in-plane average temperature of a wafer at the time when the thermal treatment was continuously performed in the thermal treatment apparatus according to the first embodiment.

FIG. 9 is a graph illustrating the in-plane average temperature of the wafer W the time when the thermal treatment was continuously performed after the temperature of the lid body became a stable state after the set temperature of the hot plate 132 was changed, and at the time when the thermal treatment was continuously performed just after the set temperature of the hot plate was changed, in the thermal treatment apparatus 40 in this embodiment.

In FIG. 9, the horizontal axis represents the number of treated wafers, and the vertical axis represents the in-plane average temperature of the wafer W. The definition and the measurement method of the in-plane average temperature of the wafer W are the same as those in FIG. 7 and therefore omitted.

As illustrated in FIG. 9, there is no variation in the in-plane average temperature of the wafer W among wafers both in the case where the thermal treatment was continuously performed after the temperature of the lid body became a stable state after a lapse of a predetermined time after the set temperature of the hot plate 132 was changed to 130° C., and in the case where the thermal treatment was continuously performed just after the set temperature of the hot plate 132 was changed to 130° C. Therefore, according to the thermal treatment apparatus 40 in this embodiment, the variation in quality of the wafer W can be suppressed. Further, the thermal treatment apparatus 40 in this embodiment has no temperature regulating mechanism composed of a peltier element or the like separately provided for regulation of the temperature of the lid body 130, and is thus simple in configuration.

Subsequently, the feedback control on the temperature of the lid body 130 in the thermal treatment apparatus 40 will be described in detail.

Figure 10:
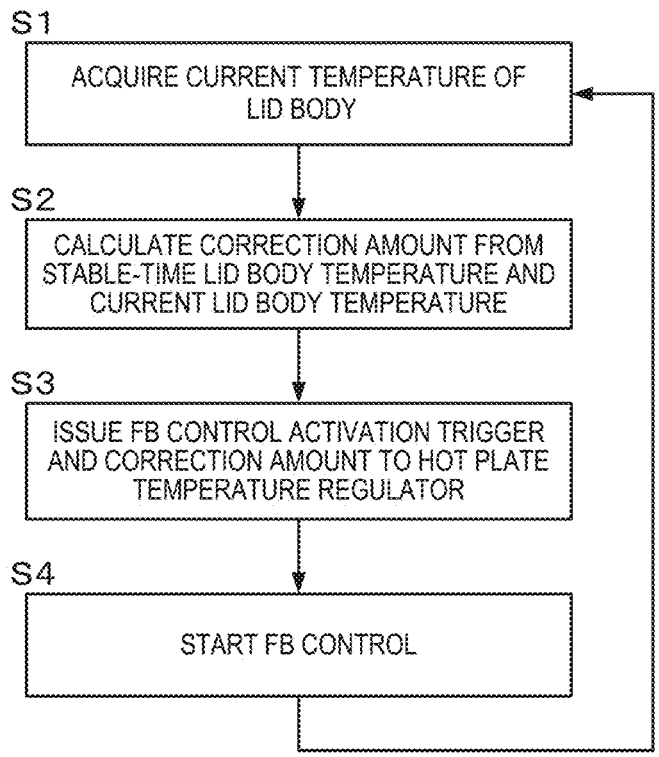
FIG. 10 is a flowchart for explaining processing performed at the time of feedback control in the first embodiment.

FIG. 10 is a flowchart for explaining processing performed at the time of the feedback control.

When the set temperature of the hot plate 132 is changed, the control unit 300 first acquires information on the current temperature of the lid body 130 from the temperature sensor 133 (Step S1).

The control unit 300 then calculates the correction amount of the heating amount by the heater 140 on the basis of the current temperature of the lid body 130 and a reference temperature corresponding to the set temperature after change, namely, the stable-time lid body temperature corresponding to the set temperature after change (Step S2). Specifically, the control unit 300 calculates the difference between the stable-time lid body temperature corresponding to the set temperature after change and the current temperature of the lid body 130, and calculates the correction amount of the heating amount by the heater 140 according to a predetermined correction expression on the basis of the difference.

The above-described predetermined correction expression is obtained in advance before an actual thermal treatment and is given as follows for instance.

For obtaining the above-described predetermined correction expression, the control unit 300 changes and regulates the temperature of the hot plate 132 to a set temperature for calculating the correction expression, and acquires, from the temperature sensor 133, the stable-time lid body temperature corresponding to the set temperature for calculating the correction expression, after the temperature of the lid body 130 becomes stable.

Further, just after the set temperature of the hot plate 132 is changed to the set temperature for calculating the correction expression and after the temperature of the lid body becomes a stable state after change, the thermal treatment is continuously performed in a state where a feedback control function for the temperature of the lid body 130 is turned OFF, and the in-plane average temperature of the wafer W and the temperature of the lid body 130 are measured for each wafer W. The in-plane average temperature of the wafer W is measured by the wafer-type temperature measuring apparatus that imitates the wafer W and has the plurality of temperature sensors and the like mounted thereon. Note that the in-plane average temperature of the wafer W is a temperature at 60 seconds after the wafer W is mounted on the hot plate 132 (wafer-type temperature measuring apparatus), and is an average value of temperatures measured at 29 points within a measurement plane of the wafer W (wafer-type temperature measuring apparatus).

Then, the difference between the set temperature for calculating the correction expression and the in-plane average temperature is calculated as the correction amount for each wafer W, and a difference $\Delta T$ between the stable-time lid body temperature corresponding to the set temperature for calculating the correction expression and the temperature of the lid body 130 is calculated.

Figure 11:
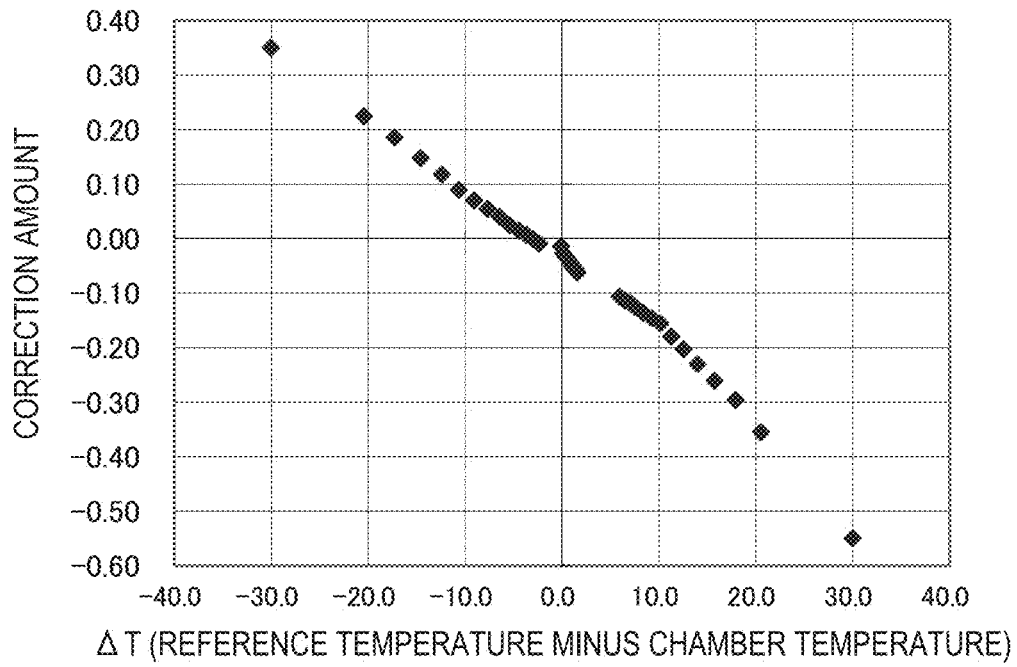
FIG. 11 is a graph illustrating the relation between a difference between a predetermined set temperature and an in-plane average temperature of the wafer, namely, a correction amount, and, a difference between a temperature of the lid body at a stable time corresponding to the predetermined set temperature and a measured temperature of the lid body.

FIG. 11 is a graph illustrating the relation between the correction amount and the difference $\Delta T$. The horizontal axis represents the difference $\Delta T$, and the vertical axis represents the correction amount.

The control unit 300 then derives an approximate expression expressing the relation in FIG. 11. The approximate expression expressing the relation between the correction amount and the difference $\Delta T$, the difference $\Delta T$ being between the stable-time lid body temperature corresponding to the set temperature for calculating the correction expression and the temperature of the lid body 130, is regarded as a correction expression expressing the relation between the correction amount and the difference, the difference being between the stable-time lid body temperature corresponding to the set temperature after change and the current temperature of the lid body 130.

Note that although a common correction expression is used even if the set temperature of the hot plate 132 is different in this example, a plurality of correction expressions may be prepared so that a different correction expression may be used according to a set temperature.

The description is returned to FIG. 10. After the calculation of the correction amount, the control unit 300 issues the calculated correction amount and a trigger of enabling the feedback control on the temperature of the lid body 130 (activation trigger) to the hot plate temperature regulator 143 (Step S3). This causes the hot plate temperature regulator 143 to correct the heating amount by the heater 140 on the basis of the issued correction amount to thereby start the feedback control on the temperature of the lid body 130 (Step S4).

Note that if the thermal treatment time for each wafer W in the thermal treatment apparatus 40 is 60 seconds, the time for performing the feedback control, namely, the time until the current temperature of the lid body 130 becomes the stable-time lid body temperature corresponding to the set temperature after change is several seconds.

Second Embodiment

Figure 12:
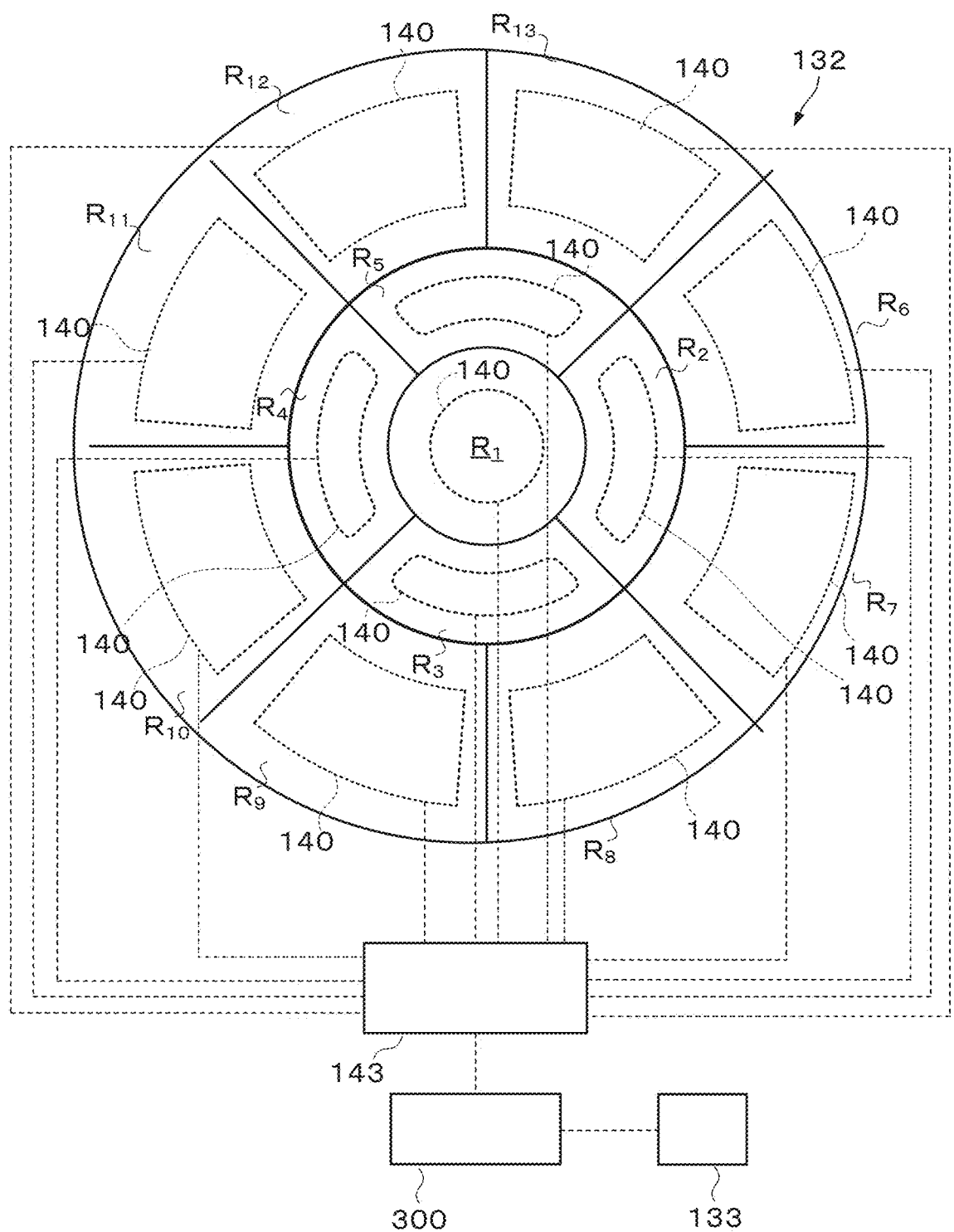
FIG. 12 is an explanatory view of a plane illustrating the outline of a configuration of a hot plate of a thermal treatment apparatus according to a second embodiment.
Figure 13:
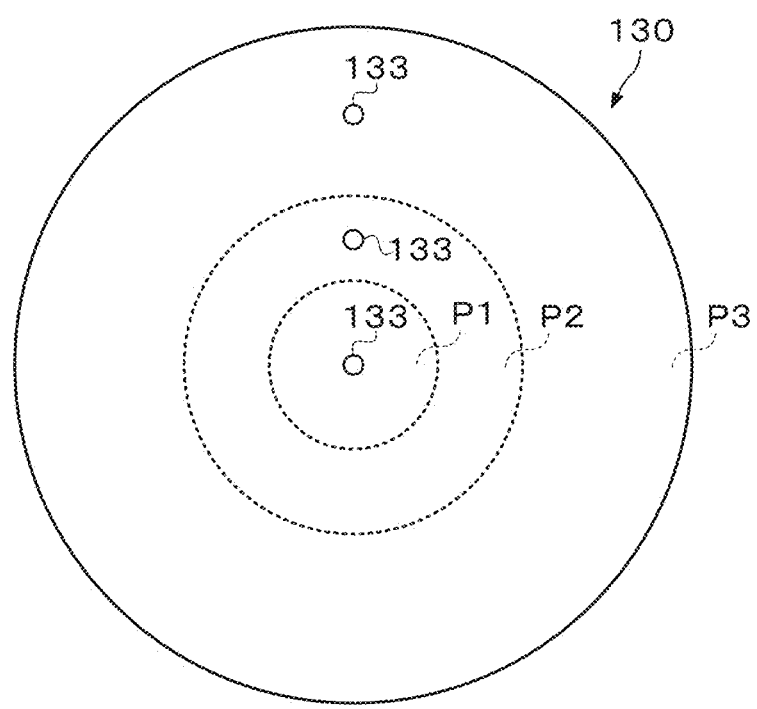
FIG. 13 is an explanatory view of a plane illustrating the outline of a configuration of a lid body of the thermal treatment apparatus according to the second embodiment.

FIG. 12 is an explanatory view of a plane illustrating the outline of a configuration of a hot plate 132 of a thermal treatment apparatus 40 according to a second embodiment. FIG. 13 is an explanatory view of a plane illustrating the outline of a configuration of a lid body 130 according to the second embodiment.

The hot plate 132 of the thermal treatment apparatus 40 according to the second embodiment is divided into a plurality of, for example, 13 hot plate regions $R_1$ to $R_{13}$ as illustrated in FIG. 12. The hot plate 132 is divided into a hot plate region $R_1$ in a circular shape located at the central portion as viewed in a plane, hot plate regions $R_2$ to $R_5$ obtained by equally dividing a surrounding area of the hot plate region $R_1$ into four parts in arc shapes, and hot plate regions $R_6$ to $R_{13}$ obtained by equally dividing a surrounding area of the regions $R_2$ to $R_5$ into eight parts in arc shapes, as illustrated in FIG. 12.

In each of the hot plate regions $R_1$ to $R_{13}$ of the hot plate 132, a heater 140 is individually embedded and can individually heat each of the hot plate regions $R_1$ to $R_{13}$. The heating value of the heater 140 in each of the hot plate regions $R_1$ to $R_{13}$ is regulated by a control unit 300 via a hot plate temperature regulator 143. The control unit 300 can regulate the heating value of each heater 140 to control the temperature of each of the hot plate regions $R_1$ to $R_{13}$ to a predetermined set temperature.

Further, as illustrated in FIG. 13, a plurality of temperature sensors 133 are provided on a lower surface of the lid body 130. The temperature sensors 133 are arranged such that one is at a portion P1 corresponding to the hot plate region $R_1$ at the center, one is at a portion P2 corresponding to the hot plate regions $R_2$ to $R_5$, and one is at a portion P3 corresponding to the hot plate regions $R_6$ to $R_{13}$.

Earnest investigation by the present inventors shows that there is a correlation between an in-plane average temperature of the portion of the wafer W corresponding to each of the hot plate regions $R_1$ to $R_{13}$ and a temperature of the portion of the lid body 130 corresponding to each of the hot plate regions $R_1$ to $R_{13}$, and the correlation is different at each of the portions.

Hence, in the thermal treatment on the wafer W by the hot plate 132, the temperature of each of the portions P1 to P3 of the lid body 130 is measured, and correction of the heating amount by the heater 140 in each of the hot plate regions $R_1$ to $R_{13}$ of the hot plate 132 is performed based on the measured result in this embodiment.

The correction of the heating amount is concretely performed as follows for instance. Specifically, the stable-time lid body temperature of each of the portions P1 to P3 of the lid body 130 is stored in advance in a storage unit (not illustrated) for each set temperature of the hot plate 132. Then, when the set temperature of the hot plate 132 is changed, the control unit 300 calculates the difference between the stable-time lid body temperature corresponding to the set temperature after change and the temperature of the lid body 130 measured by the temperature sensor 133, for each of the portions P1 to P3. Then, the control unit 300 corrects, for each of the hot plate regions $R_1$ to $R_{13}$, the heating amount by the heater 140 on the basis of the difference between the stable-time lid body temperature of each of the portions P1 to P3 corresponding to the hot plate regions $R_1$ to $R_{13}$ and the measured current temperature of each of the corresponding portions P1 to P3.

The correction of the heating amount performed by the control unit 300 is regulation of the operation amount of each of the heaters 140 outputted from the hot plate temperature regulator 143. The control unit 300 feedback-controls the temperature of each of the portions P1 to P3 of the lid body 130 through the regulation so that the temperature of each of the portions P1 to P3 of the lid body 130 becomes the stable-time lid body temperature corresponding to the set temperature after change.

Figure 14:
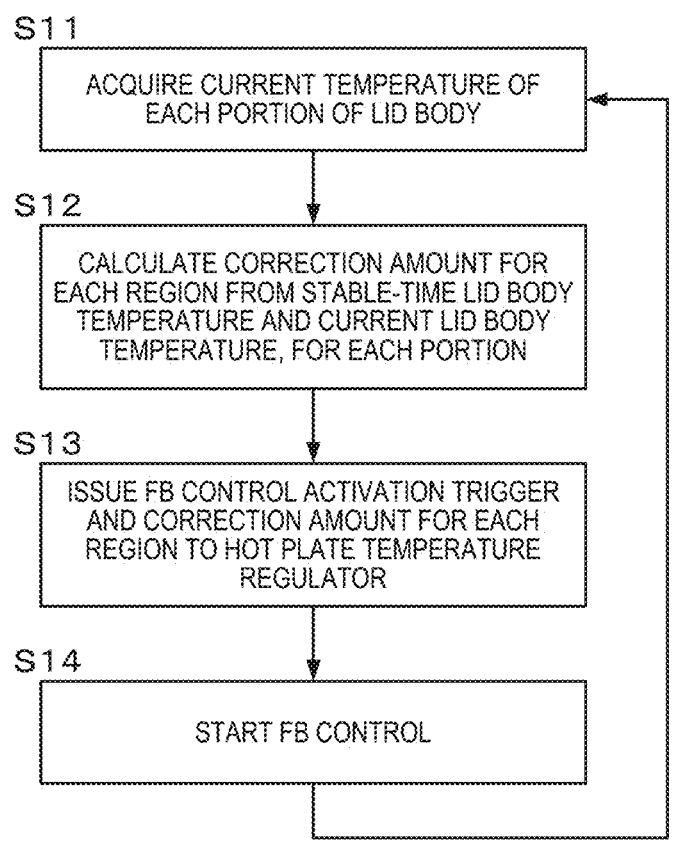
FIG. 14 is a flowchart for explaining processing performed at the time of feedback control in the second embodiment.

FIG. 14 is a flowchart for explaining processing performed at the time of feedback control according to the second embodiment.

In the thermal treatment apparatus 40 according to this embodiment, when the set temperature of the hot plate 132 is changed, the control unit 300 first acquires information on the current temperature of each of the portions P1 to P3 from the temperature sensor 133 at each of the portions P1 to P3 of the lid body 130 as illustrated in FIG. 14 (Step S11).

The control unit 300 then calculates the correction amount of the heating amount by the heater 140 on the basis of the current temperature of the lid body 130 and the stable-time lid body temperature corresponding to the set temperature after change, for each of the portions P1 to P3 (Step S12). Specifically, the control unit 300 calculates the difference between the stable-time lid body temperature corresponding to the set temperature after change and the current temperature of the lid body 130, for each of the portions P1 to P3. The control unit 300 then calculates, for each of the hot plate regions $R_1$ to $R_{13}$, the correction amount of the heating amount by the heater 140 on the basis of the difference relating to each of the portions P1 to P3 corresponding to the hot plate regions $R_1$ to $R_{13}$ according to the predetermined correction expression.

The above-described correction expression is obtained in advance before an actual thermal treatment, and can be obtained by the same method as that in the first embodiment, for example, for each of the portions P1 to P3. The correction expression may be common to the portions P1 to P3 or may be different for each of the portions P1 to P3.

After calculation of the correction amount for each of the hot plate regions $R_1$ to $R_{13}$, the control unit 300 issues the calculated correction amount and a trigger of enabling the feedback control on the temperature of the lid body 130 (activation trigger) to the hot plate temperature regulator 143 (Step S13).

This causes the hot plate temperature regulator 143 to correct the heating amount by each of the heaters 140 on the basis of the issued correction amount to thereby start the feedback control on the temperature of the lid body 130 (Step S14).

According to this embodiment, the hot plate 132 is divided into a plurality of hot plate regions $R_1$ to $R_{13}$ which can be independently temperature-regulated, and the operation amount of the heater 140 in the hot plate region $R_1$ is regulated to thereby feedback-control the temperature of the portion P1 of the lid body 130, the operation amounts of the heaters 140 in the hot plate regions $R_2$ to $R_5$ are regulated to thereby feedback-control the temperature of the portion P2 of the lid body 130, and the operation amounts of the heaters 140 in the hot plate regions $R_6$ to $R_{13}$ are regulated to thereby feedback-control the temperature of the portion P3 of the lid body 130.

Accordingly, the temperature of each of the portions P1 to P3 of the lid body 130 can quickly become stable, so that even if the wafers W are successively treated just after change of the set temperature of the hot plate 132, not only the in-plane average temperature of the wafer W never varies among wafers W but also the variation in temperature within the same wafer W can be suppressed. Therefore, according to the thermal treatment apparatus 40 in this embodiment, it is possible to suppress the variation in quality among the wafers W and the variation in quality within the same wafer W.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those also belong in the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

What is claimed is:

1. A thermal treatment apparatus comprising a hot plate on which a substrate is mounted and which heats the mounted substrate, in a treatment chamber comprising a lid body covering a surface to be treated of the substrate mounted on the hot plate, the thermal treatment apparatus comprising:
   a control unit which controls at least a temperature of the hot plate, and a temperature measuring unit which measures a temperature of the lid body,
   wherein the control unit is configured to perform, when a set temperature of the hot plate is changed, correction of a heating amount by the hot plate for obtaining a set temperature after change, based on the temperature of the lid body measured by the temperature measuring unit,
   further comprising: a storage unit which stores, in advance before an actual thermal treatment, for each predetermined set temperature of the hot plate of a plurality of predetermined set temperatures, a stable-time lid body temperature being a temperature of the lid body at which the temperature of the lid body becomes stable after change to the set temperature, wherein the correction of the heating amount by the hot plate is regulation of an operation amount of a heating unit which heats the hot plate, and wherein the control unit is configured to feedback-control the temperature of the lid body by regulating the operation amount of the heating unit so that the temperature of the lid body becomes the stable-time lid body temperature corresponding to the set temperature after change.

2. The thermal treatment apparatus according to claim 1, further comprising:

wherein the control unit is configured to perform, when the set temperature of the hot plate is changed, correction of the heating amount by the hot plate, based on a difference between the stable-time lid body temperature corresponding to the set temperature after change and the temperature of the lid body measured by the temperature measuring unit.

3. The thermal treatment apparatus according to claim 2, wherein the hot plate is divided into a plurality of regions, wherein the control unit is configured to control the temperature of the hot plate divided into the plurality of regions, for each of the regions, wherein the temperature measuring unit is configured to measure the temperature of the lid body for each portion corresponding to each of the regions of the hot plate divided into the plurality of regions, and wherein the control unit is configured to perform, when the set temperature of the hot plate is changed, correction of the heating amount by the hot plate for each of the regions, based on the temperature of the lid body of the portion corresponding to the region measured by the temperature measuring unit.

4. The thermal treatment apparatus according to claim 1, wherein the hot plate is divided into a plurality of regions, wherein the control unit is configured to control the temperature of the hot plate divided into the plurality of regions, for each of the regions, wherein the temperature measuring unit is configured to measure the temperature of the lid body for each portion corresponding to each of the regions of the hot plate divided into the plurality of regions, and wherein the control unit is configured to perform, when the set temperature of the hot plate is changed, correction of the heating amount by the hot plate for each of the regions, based on the temperature of the lid body of the portion corresponding to the region measured by the temperature measuring unit.

5. A thermal treatment method of heating a substrate by a hot plate on which the substrate is mounted, the thermal treatment method comprising:

a measurement step of measuring a temperature of a lid body covering a surface to be treated of the substrate and constituting a treatment chamber; and a correction step of performing, when a set temperature of the hot plate is changed, correction of a heating amount by the hot plate for obtaining a set temperature after change, based on the measured temperature of the lid body, further comprising: storing, in a storage unit, in advance before an actual thermal treatment, for each predetermined set temperature of the hot plate of a plurality of predetermined set temperatures, a stable-time lid body temperature being a temperature of the lid body at which the temperature of the lid body becomes stable after change to the set temperature, wherein the correction step of the heating amount by the hot plate includes regulating an operation amount of a heating unit which heats the hot plate, and further comprising feedback-controlling the temperature of the lid body by regulating the operation amount of the heating unit so that the temperature of the lid body becomes the stable-time lid body temperature corresponding to the set temperature after change.

6. The thermal treatment method according to claim 5, wherein the correction step comprises a step of performing, when the set temperature of the hot plate is changed, correction of the heating amount by the hot plate, based on a difference between a stable-time lid body temperature being a temperature of the lid body when the temperature of the lid body becomes stable after change and the measured temperature of the lid body.

7. The thermal treatment method according to claim 6, wherein the hot plate is divided into a plurality of regions individually controlled in temperature, wherein the measurement step is a step of measuring the temperature of the lid body for each portion corresponding to each of the regions of the hot plate divided into the plurality of regions, and wherein the correction step comprises a step of performing, when the set temperature of the hot plate is changed, correction of the heating amount by the hot plate for each of the regions, based on the measured temperature of the lid body of the portion corresponding to the region.

8. The thermal treatment method according to claim 5, wherein the hot plate is divided into a plurality of regions individually controlled in temperature, wherein the measurement step is a step of measuring the temperature of the lid body for each portion corresponding to each of the regions of the hot plate divided into the plurality of regions, and wherein the correction step comprises a step of performing, when the set temperature of the hot plate is changed, correction of the heating amount by the hot plate for each of the regions, based on the measured temperature of the lid body of the portion corresponding to the region.

9. A non-transitory computer-readable storage medium storing a program running on a computer of a control unit that controls a thermal treatment apparatus to cause the thermal treatment apparatus to execute a thermal treatment method of heating a substrate by a hot plate on which the substrate is mounted, wherein the thermal treatment method comprises:

a measurement step of measuring a temperature of a lid body covering a surface to be treated of the substrate and constituting a treatment chamber; and a correction step of performing, when a set temperature of the hot plate is changed, correction of a heating amount of the hot plate for obtaining a set temperature after change, based on the measured temperature of the lid body, further comprising: storing, in a storage unit, in advance before an actual thermal treatment, for each predetermined set temperature of the hot plate of a plurality of predetermined set temperatures, a stable-time lid body temperature being a temperature of the lid body at which the temperature of the lid body becomes stable after change to the set temperature, wherein the correction step of the heating amount by the hot plate includes regulating an operation amount of a heating unit which heats the hot plate, and further comprising feedback-controlling the temperature of the lid body by regulating the operation amount of the heating unit so that the temperature of the lid body becomes the stable-time lid body temperature corresponding to the set temperature after change.

10. The non-transitory computer-readable storage medium according to claim 9, wherein the correction step comprises a step of performing, when the set temperature of the hot plate is changed, correction of the heating amount by the hot plate, based on a difference between a stable-time lid body temperature being a temperature of the lid body when the temperature of the lid body becomes stable after change and the measured temperature of the lid body.

11. The non-transitory computer-readable storage medium according to claim 10, wherein the hot plate is divided into a plurality of regions individually controlled in temperature, wherein the measurement step is a step of measuring the temperature of the lid body for each portion corresponding to each of the regions of the hot plate divided into the plurality of regions, and wherein the correction step comprises a step of performing, when the set temperature of the hot plate is changed, correction of the heating amount by the hot plate for each of the regions, based on the measured temperature of the lid body of the portion corresponding to the region.

12. The non-transitory computer-readable storage medium according to claim 9, wherein the hot plate is divided into a plurality of regions individually controlled in temperature, wherein the measurement step is a step of measuring the temperature of the lid body for each portion corresponding to each of the regions of the hot plate divided into the plurality of regions, and wherein the correction step comprises a step of performing, when the set temperature of the hot plate is changed, correction of the heating amount by the hot plate for each of the regions, based on the measured temperature of the lid body of the portion corresponding to the region.

\* \* \* \* \*